(12) United States Patent
Hiblot et al.

(10) Patent No.: US 10,903,335 B2
(45) Date of Patent: Jan. 26, 2021

(54) SELF-ALIGNED INTERNAL SPACER WITH EUV

(71) Applicant: IMEC VZW, Leuven (BE)

(72) Inventors: Gaspard Hiblot, Heverlee (BE);
Sylvain Baudot, Woluwe Saint-Pierre (BE); Hans Mertens, Leuven (BE);
Julien Jussot, Kessel-Lo (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 16/408,971

(22) Filed: May 10, 2019

(65) Prior Publication Data

US 2019/0348523 A1   Nov. 14, 2019

(30) Foreign Application Priority Data

May 11, 2018  (EP) .................................. 18171948

(51) Int. Cl.
*H01L 29/66* (2006.01)
*H01L 21/02* (2006.01)
(Continued)

(52) U.S. Cl.
CPC .. *H01L 29/66553* (2013.01); *H01L 21/02134* (2013.01); *H01L 21/02164* (2013.01); *H01L 21/02282* (2013.01); *H01L 21/02348* (2013.01); *H01L 21/02532* (2013.01); *H01L 21/02603* (2013.01); *H01L 21/30604* (2013.01);
(Continued)

(58) Field of Classification Search
CPC ..... H01L 21/823431; H01L 21/823821; H01L 21/845; H01L 29/66795–66818; H01L 29/41791; H01L 29/785–786; H01L 2029/7857–7858; H01L 27/0886;
(Continued)

(56) References Cited

U.S. PATENT DOCUMENTS 9,484,447 B2   11/2016  Kim et al.
9,570,551 B1   2/2017   Balakrishnan et al.
(Continued)

FOREIGN PATENT DOCUMENTS

WO    2015/147792 A1   10/2015

OTHER PUBLICATIONS

European Search Report, European Patent Application No. 18171948. 5, dated Nov. 7, 2018, 9 pages.
(Continued)

*Primary Examiner* — Sonya McCall-Shepard
(74) *Attorney, Agent, or Firm* — McDonnell Boehnen Hulbert & Berghoff LLP

(57) ABSTRACT

A method of forming aligned gates for horizontal nanowires or nanosheets, comprising: providing a wafer which comprises at least one fin of sacrificial layers alternated with functional layers, and a dummy gate covering a section of the fin between a first end and a second end; at least partly removing the sacrificial layers at the first end and the second end thereby forming a void between the functional layers at the first and end such that the void is partly covered by the dummy gate; providing resist material which oxidizes upon EUV exposure; exposing the wafer to EUV light; selectively removing the dummy gate and the unexposed resist; forming a gate between the functional layers and between the exposed resist at the first end and at the second end.

16 Claims, 8 Drawing Sheets

(51) Int. Cl.
*H01L 21/306* (2006.01)
*H01L 29/06* (2006.01)
*H01L 29/786* (2006.01)
*H01L 29/775* (2006.01)
*H01L 29/40* (2006.01)
*H01L 29/78* (2006.01)
*H01L 29/423* (2006.01)

(52) U.S. Cl.
CPC .... *H01L 29/0673* (2013.01); *H01L 29/42392* (2013.01); *H01L 29/66545* (2013.01); *H01L 29/66742* (2013.01); *H01L 29/78696* (2013.01)

(58) Field of Classification Search
CPC ........... H01L 27/0924; H01L 27/10826; H01L 27/10879; H01L 27/1211; H01L 29/0669–0676
See application file for complete search history.

(56) References Cited

U.S. PATENT DOCUMENTS

| | | |
|---|---|---|
| 9,893,167 B2 | 2/2018 | Kim et al. |
| 9,923,055 B1 | 3/2018 | Cheng et al. |
| 2008/0135949 A1* | 6/2008 | Lo .................. B82Y 10/00 257/401 |
| 2017/0069763 A1 | 3/2017 | Doris et al. |

OTHER PUBLICATIONS

Coquand, R. et al., "Innovative Through-Si 3D Lithography for Ultimate Self-Aligned Planar Double-Gate and Double-Gate-All-Around Nanowire Transistors", Symposium on VLSI Technology Digest of Technical Papers, IEEE, Jun. 11, 2013, pp. T226-T227.

* cited by examiner

SELF-ALIGNED INTERNAL SPACER WITH EUV

CROSS-REFERENCE TO RELATED APPLICATIONS

The present application is a non-provisional patent application claiming priority to European Patent Application No. 18171948.5, filed on May 11, 2018, the contents of which are hereby incorporated by reference.

FIELD OF THE DISCLOSURE

The disclosure relates to the field of semiconductor devices comprising nanowires or nanosheets. More specifically it relates to a method of forming a semiconductor device comprising nanowires or nanosheets.

BACKGROUND

Stacked nanowires built from a Si/SiGe superlattice are one of the main contenders for the 7 nm node architecture, as the wrapped around gate offers ultimate control of the channel.

The complexity of this architecture stems from the need to integrate the gate between the channels. An internal spacer must be included to separate the junctions from the buried gates, otherwise the parasitic capacitance of the transistors damage excessively the electrical performance. In the standard flow the internal spacers (defining the buried gate length) are processed by a wet etch of the sacrificial SiGe. After the recess of the sacrificial SiGe the internal spacer is inserted from the sides (see for example U.S. Pat. No. 9,484,447 B2).

This creates an additional problem of gate length variation in the nanowire stack, because the buried gate length is defined by the spacer recess and is therefore not self-aligned with the top gate. Therefore, gate length variation may arise between the different nanowires staked together.

To solve this issue, a "nanowire-first" flow using e-beam and HSQ lithography was explored. It exploits the ability of e-beam lithography to expose HSQ through the stacked channels and was explored by CEA-LETI and is explained in "Innovative through-Si 3D lithography for ultimate Self-Aligned Planar Double-Gate and Gate-All-Around nanowire transistors" Coquand VLSI 2013. The nanowires are released before the dummy gate formation, in contrast to the standard flow (e.g. U.S. Pat. No. 9,484,447 B2) where the SiGe is released after dummy gate removal. This flow is difficult to apply in an industrial environment due to the low throughput of the e-beam process, and the pillars on the sides of the channel which are used to maintain the released nanowire without supporting gates.

In view of these problems there is room for improvement in methods of forming a semiconductor device comprising nanowires or nanosheets.

SUMMARY

The present disclosure provides a method of forming a semiconductor device comprising nanowires or nanosheets.

Embodiments of the present disclosure relate to a method of forming aligned gates for horizontal nanowires or nanosheets. These methods comprise the following steps.

Providing a wafer. The wafer comprises a semiconductor structure which comprises at least one fin. The at least one fin comprises a stack of sacrificial layers alternated with functional layers. The semiconductor structure comprises a dummy gate which covers a section of the fin between a first end of the section and a second end of the section.

At least partly removing the sacrificial layers in between the functional layers, at the first end and the second end of the section. Thereby a void is formed between the functional layers at the first end of the section and a void is formed between the functional layers at the second end of the section. The void at the first end is partly covered by the dummy gate, and part is not covered by the dummy gate. The void at the second end is partly covered by the dummy gate, and part is not covered by the dummy gate.

Providing resist material in the void at the first end of the section and in the void at the second end of the section. The resist material is selected such that it oxidizes upon EUV exposure.

Exposing the wafer to EUV light thereby converting the exposed resist to an oxide. Only the resist which is not covered by the dummy gate will be exposed. The resist under the dummy gate is unexposed.

Selectively removing the dummy gate and the unexposed resist.

Forming a gate between the functional layers and between the exposed resist at the first end and the exposed resist at the second end of the section. Thus, gates are obtained which are aligned with the exposed resist at the first end and the second end of the section. These gates are gates for the functional layers. The functional layers are thereby corresponding with the nanowires or nanosheets.

By using an EUV/resist lithography, a self-aligned internal spacer can be obtained in vertically stacked nanowires or nanosheets. Using the dummy gate as an EUV mask, the resist is only exposed outside the gate, and densifies into an oxide at the exposed locations. This oxide forms the self-aligned internal spacer. This solves the issue of gate length variations between the different channels of the stack.

Some of embodiments of the present disclosure allow for a high throughput to be obtained thanks to EUV.

In embodiments of the present disclosure the provided resist material is hydrogen silsesquioxane.

In some embodiments of the present disclosure, HSQ converts into $SiO_x$ after exposing it to EUV light (x may for example be between 1 and 2). This allows for the removal of the unexposed HSQ while keeping the $SiO_x$ in place.

In embodiments of the present disclosure, the resist is applied by spin coating.

In embodiments of the present disclosure, the sacrificial layer is partly removed such that a pillar of the sacrificial layer is remaining. A width of this pillar is shorter than a predefined gate length. The predefined gate length thereby corresponds to the gate length defined by the dummy gate. This is the length between the first end and the second end of the section of the fin.

Some embodiments of the present disclosure remove the need to have pads on each side of the transistor since the supporting pillar is supporting the functional layers.

In embodiments of the present disclosure forming the gate comprises: (i) depositing gate dielectric material around the nanowires or nanosheets, and (ii) depositing gate material around the gate dielectric material thereby forming the gate.

In embodiments of the present disclosure, the sacrificial layers are at least partly removed by isotropic etching.

In embodiments of the present disclosure, a source is formed at one side of the nanowire material next to the dummy gate or gate and a drain is formed at an opposite end of the nanowire material at the opposite side of the dummy gate or gate.

In embodiments of the present disclosure, an implant anneal step is applied. It may be beneficial when that anneal step is applied after removing the unexposed resist. Heating before removal of the unexposed resist would result in an oxidation of the resist and hence to a less accurately defined gate length.

In embodiments of the present disclosure, providing the wafer comprises depositing a stack of layers on a substrate. The stack of layers comprises alternating sacrificial and functional layers. After depositing the stack at least one fin is formed in the stack.

In embodiments of the present disclosure, at least two functional layers are deposited or even at least three functional layers are deposited.

In embodiments of the present disclosure, depositing of the stack comprises depositing functional layers which are comprising Silicon, or SiGe, or Ge, or InGaAs, or III-V material.

Some embodiments of the present disclosure allow for them to be applied to different nanowire or nanosheet device architectures. Examples include are Si, SiGe, Ge, or III/V nanowire/nanosheet integration schemes. Other example may be possible.

In embodiments of the present disclosure, depositing of the stack comprises depositing functional layers which are comprising Ge and sacrificial layers which are comprising SiGe.

In embodiments of the present disclosure, depositing of the stack comprises depositing functional layers which are comprising Si and sacrificial layers which are comprising SiGe.

Some aspects of the disclosure are set out in the accompanying independent and dependent claims. Features from the dependent claims may be combined with features of the independent claims and with features of other dependent claims as appropriate and not merely as explicitly set out in the claims.

These and other aspects of the disclosure will be apparent from and elucidated with reference to the embodiment(s) described hereinafter.

BRIEF DESCRIPTION OF THE FIGURES

The above, as well as additional, features will be better understood through the following illustrative and non-limiting detailed description of example embodiments, with reference to the appended drawings.

Figure 1:
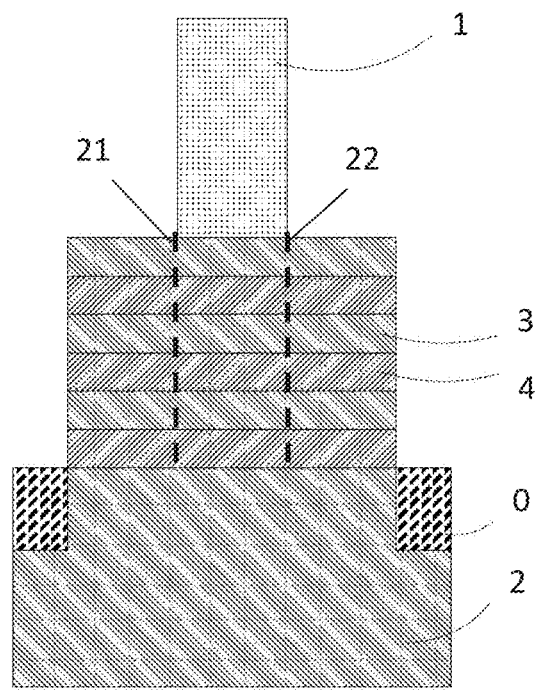
FIG. 1 shows a cross-section in the length direction of a fin of a semiconductor structure, according to an example embodiment.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

Moreover, the terms top, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of example embodiments of the disclosure, various features of the disclosure are sometimes grouped together in a single embodiment, figure, or description thereof for the purpose of streamlining the disclosure and aiding in the understanding of one or more of the various aspects. This method of disclosure, however, is not to be interpreted as reflecting an intention that the claims require more features than are expressly recited in each claim. Rather, as the following claims reflect, some aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

Where in embodiments of the present disclosure reference is made to nanowire material or nanosheet material, reference is made to material from which the functional layers, and hence the resulting nanowires or nanosheets are made.

Where in embodiments of the present disclosure reference is made to sacrificial material, reference is made to material from which the sacrificial layers are made.

Embodiments of the present disclosure relate to a method for forming aligned gates for nanowires or nanosheets. The disclosure reported here uses self-aligned resist-based internal spacers. A fin comprising a stack of sacrificial layers alternated with functions layers is partly covered by a dummy gate. The side-recess of the sacrificial layer is pushed further under the dummy gate, and the resulting gap is filled by resist. Using EUV (extreme ultraviolet) lithography, the resist below the gate is not exposed and can be removed selectively later. The resist is selected such that the exposed resist turns into an oxide which can be used as an internal spacer. The boundary between the non-exposed resist and oxide later defines the gate length of the stacked nanowires or nanosheets during the dummy gate removal. This process also solves the throughput issue since EUV can be used to expose the resist in a self-aligned way, in contrast to a flow where the e-beam defines each gate individually.

In embodiments of the present disclosure, the dummy gate is used for the self-aligned step. As a result, the internal edge of the spacer is self-aligned. This may be beneficial because the internal edge of the spacer defines the gate length. The present disclosure enables the same gate length between all the nanowires or nanosheets of the stack. There is, moreover, no opacity requirement for the spacer, since the external spacer is not used as a mask.

Figure 13:
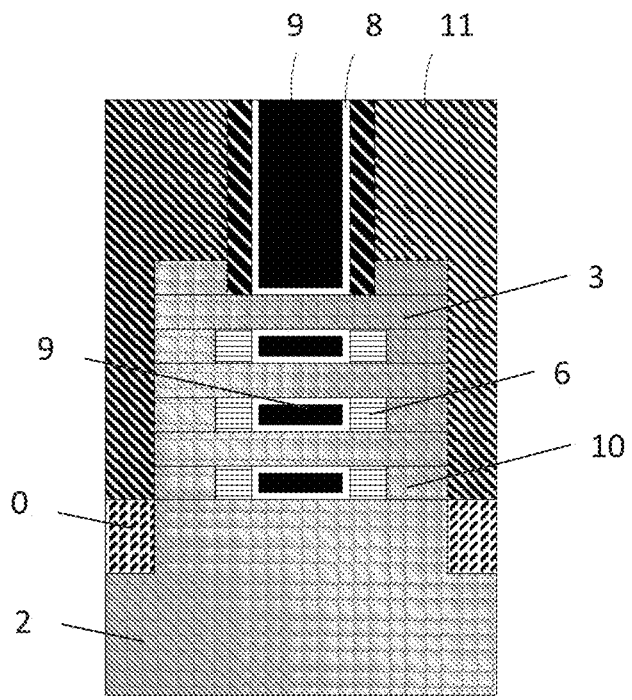
FIG. 13 shows a schematic drawing of the stack after forming a high-K/metal gate, according to an example embodiment.

A method 100 according to embodiments of the present disclosure comprises the following steps (also illustrated in FIG. 13).

Providing 110 a wafer comprising a semiconductor structure which comprises at least one fin. The at least one fin comprises a stack of sacrificial layers 4 alternated with functional layers 3. The semiconductor structure comprises a dummy gate 1 which partly covers the stack of layers of the at least one fin. The dummy gate may for example cover the top of the fin and the sidewalls of the fin over a section of the fin. Such a section extends over part of the length of the fin between a first end 21 and a second end 22 of the section.

The method also comprises at least partly removing 120 the sacrificial layers 4 in between the functional layers 3, under the dummy gate 1 thereby forming a void between the functional layers under the dummy gate 1. Thus, a void (i.e. empty space) which can be filled with resist material is created at both ends of the section. A void is present at the first end 21 and at the second end 22 of the section. The void at the first end 21 is on one side of the first end covered by the dummy gate and at the other side of the first end not covered by the dummy gate. The is similar for the void at the second end 22. The void at the first end 21 of the section may extend to the void at the second end 22 of the section. In some embodiments of the present disclosure sacrificial material may be remaining underneath the dummy gate. In some embodiments of the present disclosure it may be completely removed.

Resist material is provided 130 within the void at the first end and at the second end of the section. The resist material is selected such that it oxidizes upon EUV exposure.

In a next step the wafer is exposed to EUV light such that the part of the resist which is covered by the dummy gate is not exposed to the EUV light. The part of the resist that is exposed to the EUV light is converted to an oxide.

In a next step the dummy gate and the unexposed resist are selectively removed 150.

In a next step a gate is formed 160 around the released nanowires or nanosheets (at the former position of the unexposed resist and the sacrificial material underneath the dummy gate). This gate is present between the functional layers and between the exposed resist at the first side and the second side of the section. The exposed resist (i.e. the oxidized resist) thereby delineates the gate. Thus, gates are obtained which are aligned with the edges of the oxidized resist. These edges are defined by the EUV which did not reach the resist which was covered by the dummy gate. The functional layers are corresponding with the nanowires or nanosheets.

The difference between a nanowire and a nanosheet is in the ratio between the width and the height of the nanowire or the nanosheet. For a nanowire this ratio may be around one whereas for a nanosheet it is larger than one (a typical ratio could for example be between 3 and 20). A nanowire may for example have a width of around 7 nm. The disclosure is, however, not limited thereto.

Using this method nanowires or nanosheets may be obtained with a gate all around the nanowire or nanosheet. The gate length is defined by the exposure of the resist by the EUV.

The resist material may be a resin. It may for example be hydrogen silsesquioxane (HSQ).

In e-beam and EUV, the exposure of the resist is induced by secondary electrons emitted by the photons (EUV) or by primary electrons (e-beam).

Secondary electrons can be generated through the stack of functional and sacrificial layers (this may for example be a stack of Si and SiGe layers). Exposure through the functional layers (e.g. Si) is possible in both cases.

EUV allows full wafer exposure. This is not possible with e-beam. EUV, moreover, allows self-aligned patterning. This is also not possible with e-beam as the electron energy is too high for self-aligned patterning in e-beam. This is due to the penetration of the primary electrons of the e-beam which is not stopped by the gate, while the penetration of the EUV photons in the hard mask is preventing them from reaching the channel.

If the penetration depth of the secondary electrons does not create enough contrast, a layer which is attenuating or even blocking EUV can be added in the gate stack. This may be beneficial to reduce the flux of the EUV towards the channel. This is, however, not strictly necessary when the hard mask in the gate stack is reducing the flux of the EUV sufficiently such that only a limited amount is reaching the channel below the gate.

FIG. 1 to FIG. 12 show cross-sections of a semiconductor structure comprising a fin. Each cross-section is parallel to the longitudinal direction of the fin and orthogonal to the wafer. The different figures show different intermediate stacks for different steps in the method, in accordance with embodiments of the present disclosure. In these figures the sacrificial layers are SiGe layers and the functional layers as Si layers. The disclosure is however not limited to these materials. In embodiments of the present disclosure, the sacrificial layers may be SiGe layers and the functional layers may be Si layers. In embodiments of the present disclosure, the functional layers may for example comprise Silicon, or SiGe, or Ge, or InGaAs, or III-V material.

Figure 2:
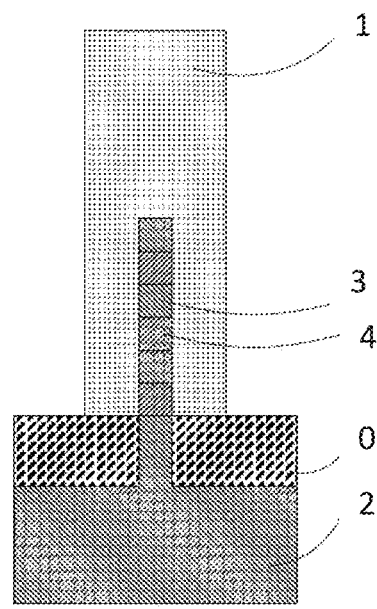
FIG. 2 schematically shows a cross-section orthogonal to the length direction of the fin of FIG. 1, wherein the channel is covered by the dummy gate.

FIG. 1 shows a semiconductor structure which is provided 110 in a method according to an example embodiment. FIG. 1 shows a cross-section in the length direction of a fin of the semiconductor structure. FIG. 2 schematically shows a cross-section of the same semiconductor structure orthogonal to the length direction of the fin.

For obtaining this stack, a silicon wafer (e.g. (100)) 2 is provided. In this wafer well implantations may be provided. Next a superlattice is provided comprising Si layers 3, and SiGe layers 4. This stack of superlayers may be obtained using epitaxial growth.

The thickness of the Si layers may for example be between 2 nm and 20 nm. The thickness of the SiGe layers may for example be between 2 nm and 20 nm. The numbers of Si layers or SiGe layers may for example be between 2 and 10.

After providing the alternating stack of functional and sacrificial layer, fins are fabricated. These may be fabricated using self-aligned-double-patterning.

Shallow trench isolations 0 (STI) may be provided by STI etching, followed by STI fill and recess.

A buffer oxide, also known as PAD oxide may be applied on top of the fins. This PAD oxide may be considered to be part of the dummy gate. The dummy gate may for example comprise an oxide layer, a polysilicon layer, and a hard mask. The hardmask may for example comprise $SiO_2$ and SiN.

A dummy gate 1 is applied on top of the fins (e.g. on top of the buffer oxide). The dummy gate covers a section of the fin between a first end 21 and a second end 22 of the section. These ends are illustrated by the dashed lines in FIG. 1 (and in some of the following drawings, but not in all in order not to overload them). The dummy gate may for example be a dummy polysilicon gate. After providing the dummy gate 1, a $SiO_2$ hardmask may be applied on the dummy gate. This step may be followed by a step wherein the $SiO_2$ hardmask is patterned, and after which the dummy gate is patterned. This step may be followed by extension implantations.

Figure 3:
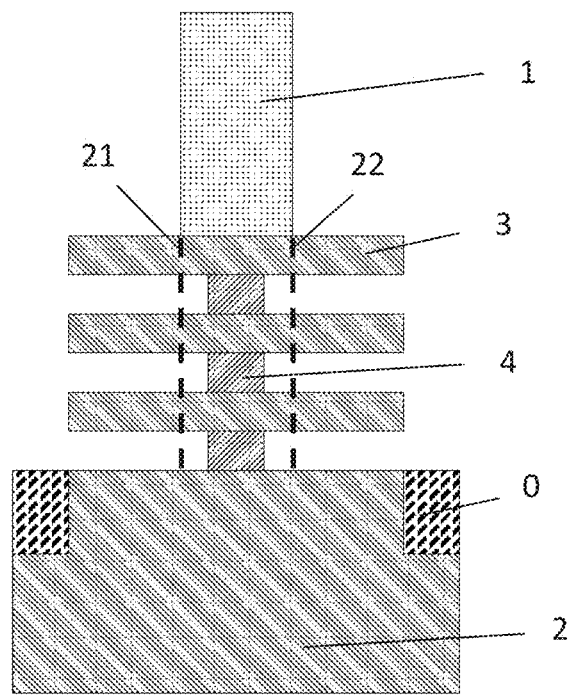
FIG. 3 schematically shows a cross-section of the resulting stack after partly removing the sacrificial layer, according to an example embodiment.

FIG. 3 schematically shows a cross-section of the resulting stack after partly removing the sacrificial layers 4. After recessing the sacrificial layers (SiGe recess) the nanowire or nanosheet 3 is partly released. Optionally a pillar 4 of sacrificial material (e.g. SiGe) may remain at the center, after removing the sacrificial material from both sides of the dummy gate. These remaining pillars 4 may serve to support the nanowires to avoid that the nanowires or nanosheets collapse. Instead of, or in combination with the pillars the dummy gate 1 may support the nanowires or nanosheets. Some embodiments of the present disclosure remove the need for supporting pads. In embodiments of the present disclosure the sacrificial layers may be completely removed.

Figure 4:
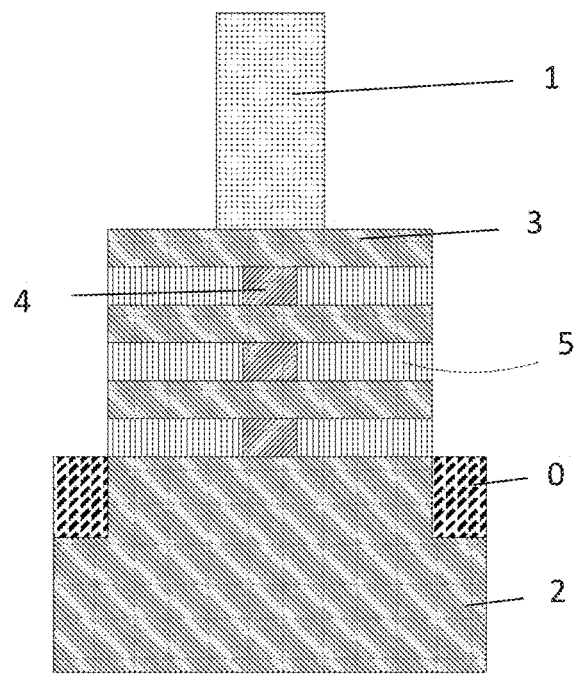
FIG. 4 schematically shows a cross-section of the resulting stack after resist deposition and etching, according to an example embodiment.

Although in FIG. 3 and FIG. 4 the remaining parts of the sacrificial layer 4 are drawn as if they are aligned with each other, this is not required. A non-aligned removal (e.g. by etching) of the sacrificial layer is allowable if the remaining pillars (if any) are within the longitudinal spacing of the eventual gate.

After removing the sacrificial material, the resulting voids are filled with resist material. This material is selected such that it oxidizes upon EUV exposure (the resist may for example comprise HSQ). FIG. 4 shows the resist 5 after resist deposition and etching. The resist may for example be deposited by spin coating. The deposition step may be followed by dry etching. Where HSQ is used as resist, the HSQ conformality allow for the filling of narrow spaces between two stacked functional layers.

Figure 5:
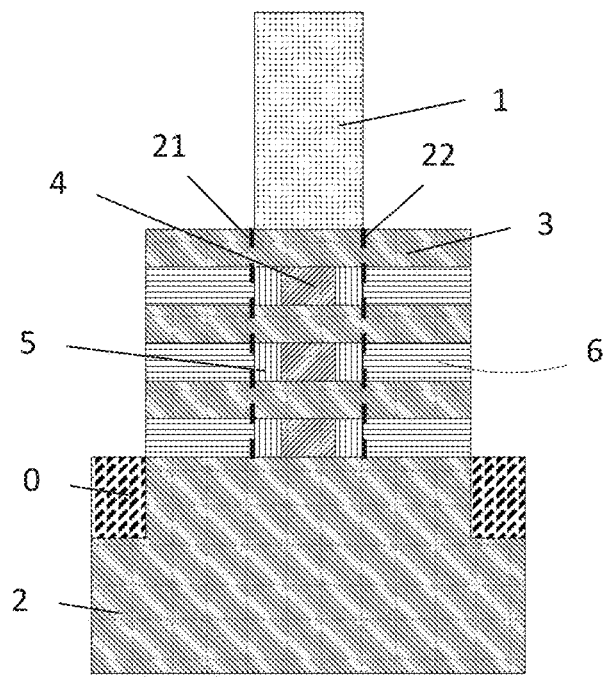
FIG. 5 shows the stack after exposure to EUV, according to an example embodiment.

After providing 130 the resist within the void, the full wafer is exposed to EUV light. The exposed resist will thereby convert into an oxide 6. FIG. 5 shows the stack after exposure to EUV. The part of the resist (e.g. HSQ) which is exposed to the EUV is converted into an oxide 6 (e.g. $Si_x$). This is the internal spacer. HSQ will for example convert into $SiO_x$. The resist under the dummy gate which is not exposed to the EUV light is not converted. The edge between the converted resist (e.g. $SiO_x$) and the unconverted resist (e.g. HSQ) is aligned on the dummy gate.

Figure 6:
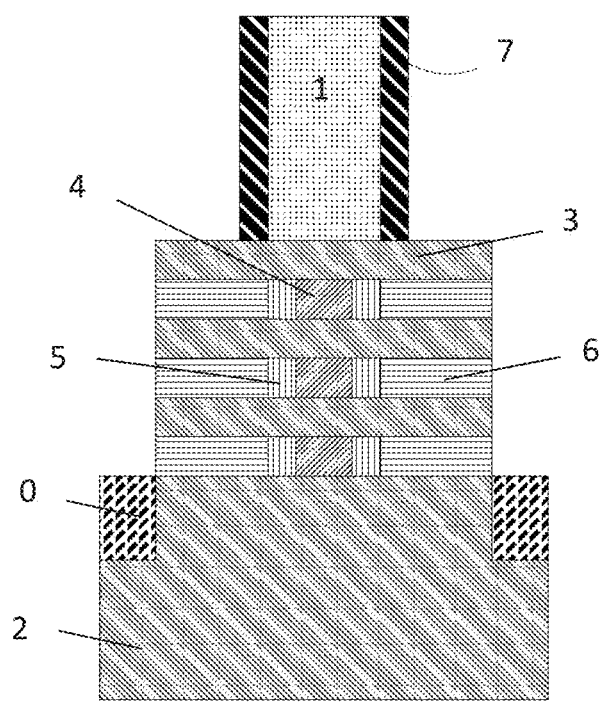
FIG. 6 shows the stack after applying an external spacer over the dummy gate, according to an example embodiment.

FIG. 6 shows the stack after applying an external spacer 7 over the dummy gate. A SiN spacer may for example be deposited and etched such that the internal spacer (the exposed resist) is accessible for etching.

Figure 7:
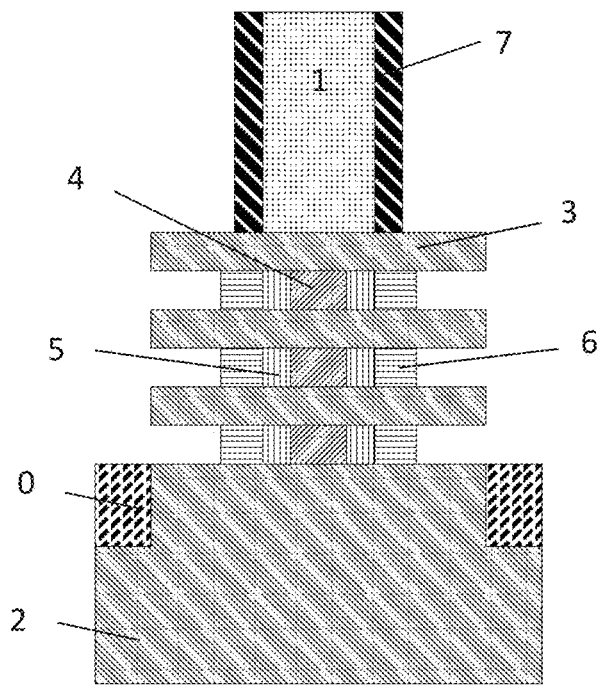
FIG. 7 shows the stack after recessing the internal spacer, according to an example embodiment.
Figure 8:
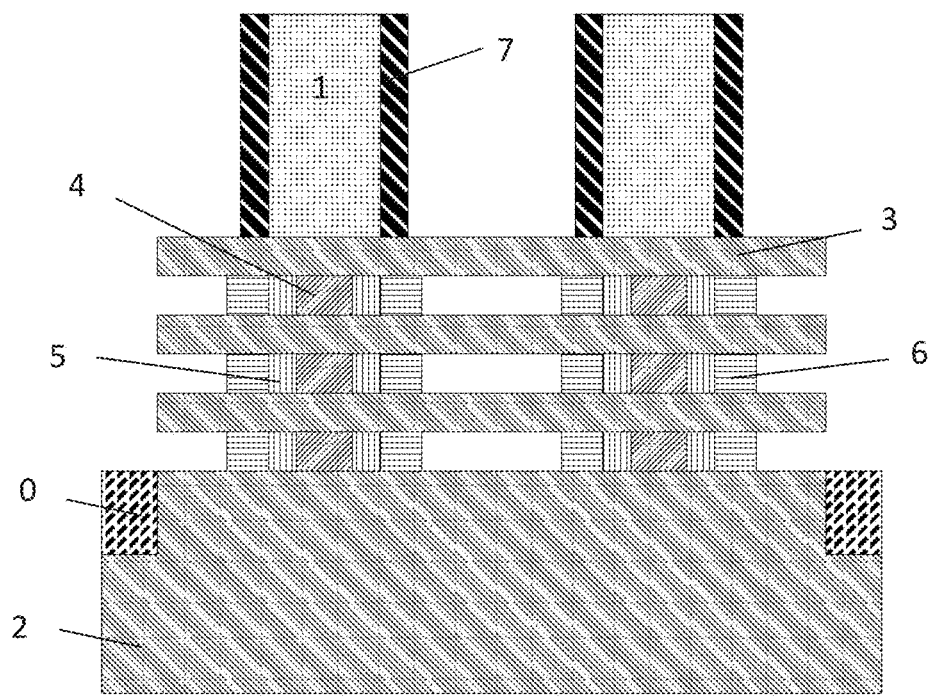
FIG. 8 shows a cross-section of stacked gates without diffusion break after recessing the internal spacer, according to an example embodiment.
Figure 9:
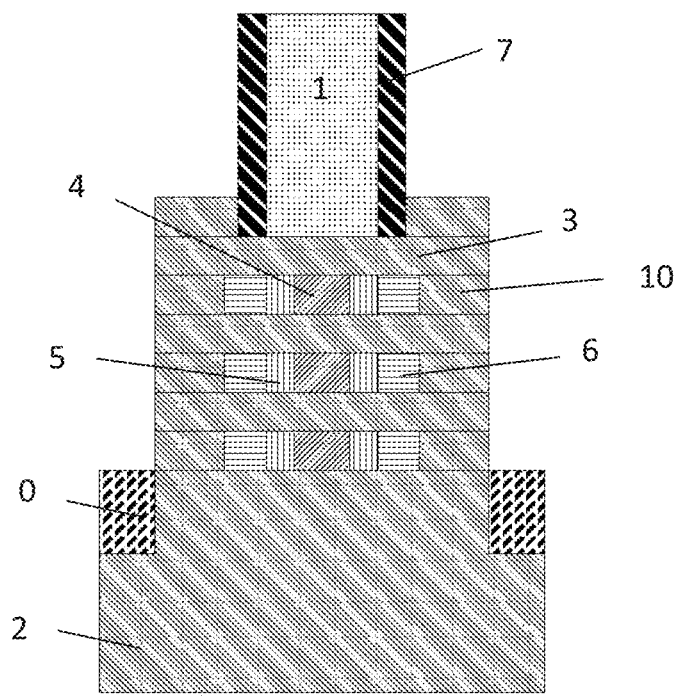
FIG. 9 shows the stack after epitaxially growing source/drain material in the voids between the nanowires or nanosheets, according to an example embodiment.

FIG. 7 and FIG. 8 show a stack after recessing the internal spacer 6.

Next the source/drain 10 may be deposited. This may be achieved by epitaxially growing the source/drain material (e.g. silicon) in the voids between the nanowires or nanosheets. The epitaxial growth is done at low temperature. The reason therefore is that under the gate unconverted resist (e.g. HSQ) is present. As long as the length of the gates is not yet fixed, the temperature of the following processing steps should not too high to prevent unconverted resist to convert into an oxide because this would result in a change of the gate length.

Solid phase epitaxial regrowth (SPER) may for example be applied. The temperature is below the temperature at which the resist would oxidize. Thus, oxidation of the not exposed resist is prevented. Instead of epitaxially growing the material an amorphous material may be deposited. FIG.

9 illustrates the resulting stack after epitaxially growing silicon. This step may be followed by an implant step.

An interlayer dielectric (ILD) may be deposited over the stack and over the SiN spacer, followed by ILD chemical mechanical polishing (CMP) on the gate.

Figure 10:
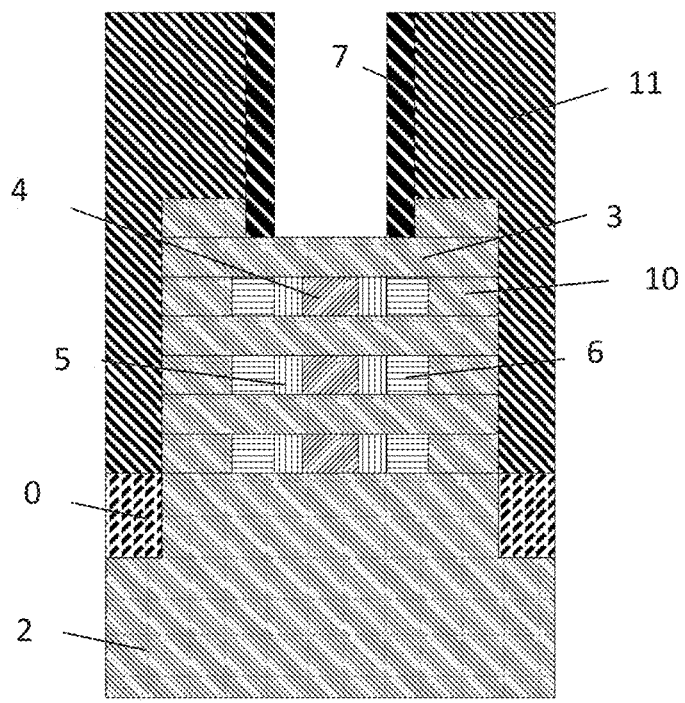
FIG. 10 shows a schematic drawing of the stack after ILD filling and selectively removing the dummy gate, according to an example embodiment.

FIG. 10 shows a schematic drawing of the stack after ILD (interlayer dielectric) filling and after selectively removing the dummy gate. In this graph the layer 11 represents the ILD.

Figure 11:
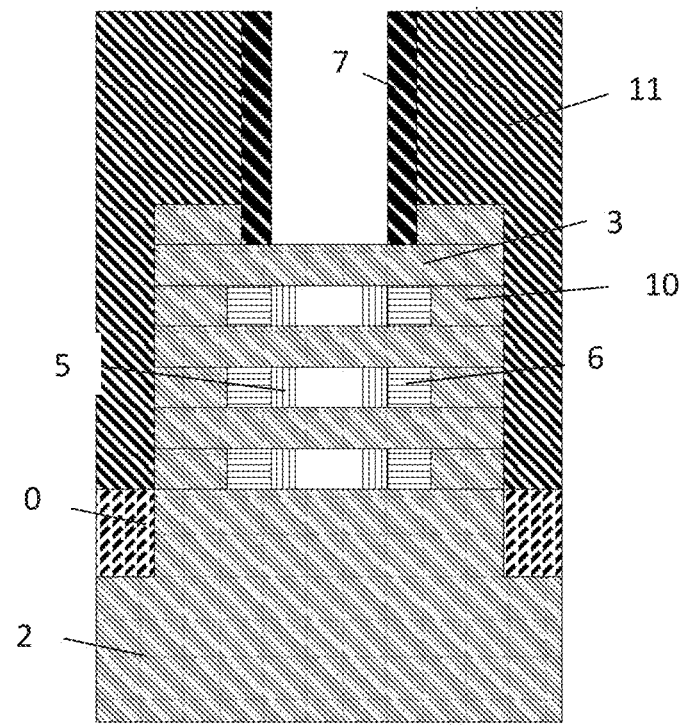
FIG. 11 shows a schematic drawing of the stack after removal of the sacrificial material through the gate, according to an example embodiment.

FIG. 11 shows a schematic drawing of the stack after removal of the sacrificial material 4 (e.g. SiGe) through the gate.

Figure 12:
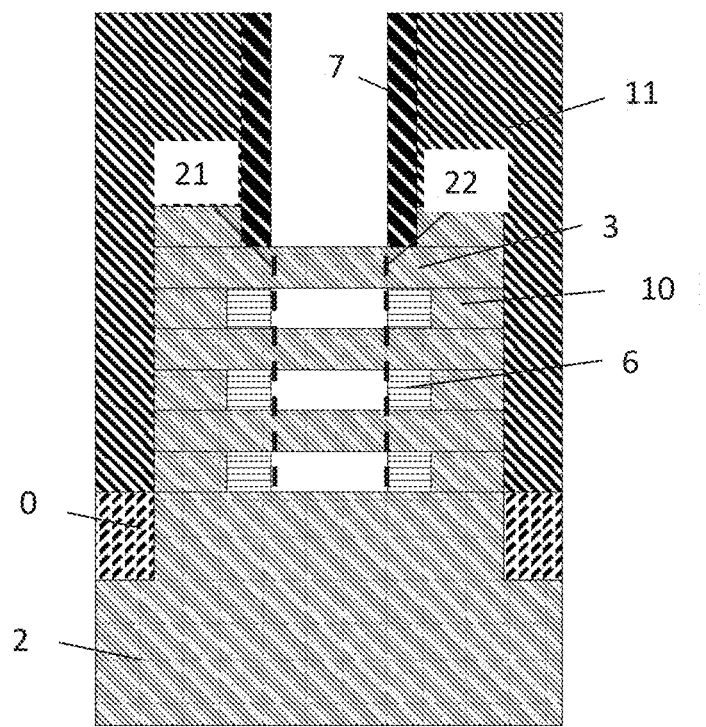
FIG. 12 shows a schematic drawing of the stack after removal of the unexposed resist through the gate, according to an example embodiment.

FIG. 12 shows a schematic drawing of the stack after removal of the unexposed resist 5 (e.g. unexposed HSQ) through the gate.

After removal of the unexposed HSQ high temperature steps may be performed such as a heavily doped drain (HDD) anneal step and a SPER crystallization step.

In methods according to embodiments of the present disclosure, a gate is formed around the released nanowires or nanosheets (at the former position of the unexposed resist and the sacrificial material underneath the dummy gate). A high-K/metal gate may be deposited (high K+ work function metal deposition). The gate dielectric layer may be obtained by atomic layer deposition of $HfO_2$. The gate materials may be workfunction metals, such as TiN, TiC, TaN or TiAl. W filling may be done for the contacting.

Figure 14:
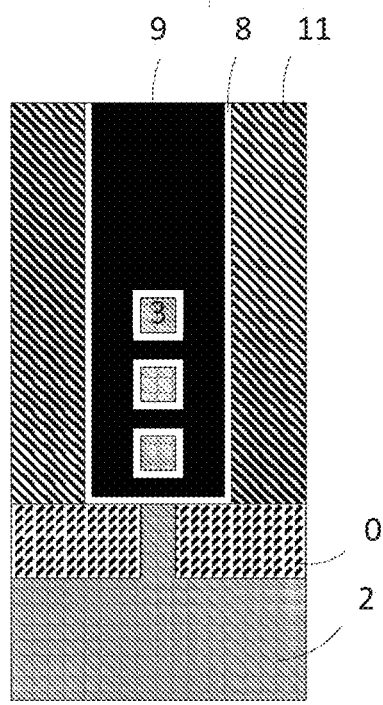
FIG. 14 schematically shows a cross-section orthogonal to the length direction of the fin of FIG. 13.
Figure 15:
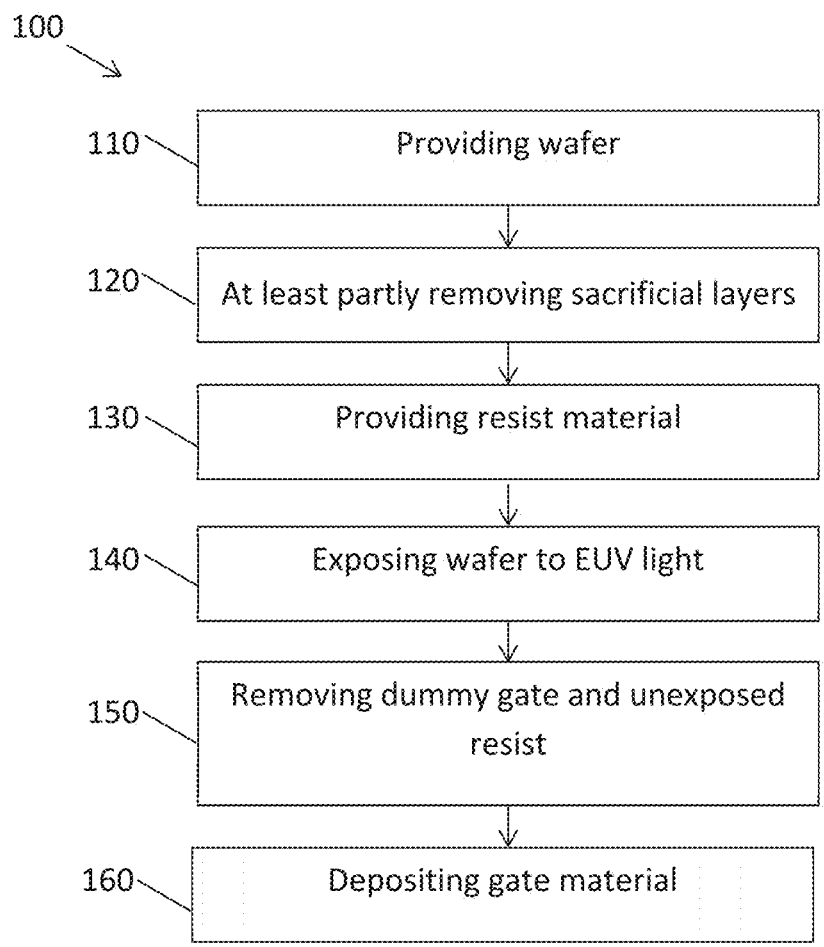
FIG. 15 shows different steps of a method, according to an example embodiment.

An example of a resulting stack is schematically illustrated in FIG. 13 and FIG. 14 showing a gate oxide 8 and a gate metal 9 (replacement gate). FIG. 13 shows a cross-section in the length direction of the fin whereas FIG. 14 shows a cross-section orthogonal to the length direction of the fin. Planarization may be achieved using CMP.

In embodiments of the present disclosure, the resulting gate may for example have a length between 7 nm and 200 nm, for example of 20 nm. The accuracy of the gate length may for example range between 0 and 3 nm.

Due to its high energy, EUV radiation is absorbed in practically all materials. However, the emission wavelength of EUV lithography (e.g. between 11 and 14 nm, e.g. about 13.5 nm) corresponds to a peak of the penetration depth for Silicon (900 nm). Therefore, EUV lithography through Si is possible. Also, SiGe and III-V materials have a sufficient penetration depth for the principle of this disclosure to work.

The EUV photons penetration is much lower in the hard mask of the dummy gate (about 100 nm which is close to 10 times less). Therefore, the dummy gate is efficient as an EUV mask. The disclosure is applicable to stacks wherein the penetration length of the dummy gate is shorter than the penetration length through the functional layers. In that case the difference in penetration length allows to obtain a self-aligned internal spacer. Fine-tuning of the dummy gate allows to maximize the contrast. This can be achieved by tuning the hard mask thickness and the composition (e.g. by adding oxides which are opaque to EUV)

In embodiments of the present disclosure, the applied resist may be HSQ. To avoid that the thermal budget causes the HSQ resist to transform into $SiO_2$ the unexposed HSQ is preferably not exposed to temperatures above 400° C. As already explained when elaborating on the method steps in the previous paragraphs the high temperatures may for example be avoided by a very low temperature EPI or by a delayed thermal step (using e.g SPER). The high temperature step can for example be shifted between the step wherein the sacrificial material and the unexposed resist are removed (e.g. HSQ/SiGe removal) and the step wherein the gate is deposited (e.g. HKMG deposition). This will cause nanowire or nanosheet trimming due to oxidation but this is acceptable.

In embodiments of the present disclosure wherein HSQ is used as resist and wherein the HSQ is exposed to EUV, a resolution down to 20 nm or even smaller is achievable.

The process flow is also effective between gates without active break. FIG. 8 shows a cross-section of stacked gates without diffusion break. In that case the sacrificial material is removed between the two gates and the nanosheets or nanowires extend between the two gates.

The following steps may be applied:
a) dummy gate patterning
b) recess of the sacrificial material (e.g. SiGe)
c) filling of the resist (e.g. HSQ)+dry etch+expose to EUV
d) recess of the resist.

Using embodiments of the present disclosure it is possible to create vertically stacked gate all around devices. Nanowires or nanosheets with a gate all around the nanowire or nanosheet can be obtained.

Methods according to embodiments of the present disclosure may, for example, be deployed in a CMOS 7 nm process flow.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A method of forming aligned gates for horizontal nanowires or nanosheets, the method comprising:
providing a wafer comprising a semiconductor structure which comprises at least one fin, the at least one fin comprising a stack of sacrificial layers alternated with functional layers, the semiconductor structure comprising a dummy gate covering a section of the fin between a first end of the section and a second end of the section,
at least partly removing the stack of sacrificial layers in between the functional layers, at the first end and the second end of the section thereby forming a void between the functional layers at the first end of the section and a void at the second end of the section such that the void at the first end is partly covered by the dummy gate and such that the void at the second end is partly covered by the dummy gate,
after at least partly removing the stack of sacrificial layers, providing a resist material within the void at the first end of the section and within the void at the second end of the section, wherein the resist material is selected such that it oxidizes upon exposure to extreme ultraviolet (EUV) light,
exposing the wafer to EUV light thereby converting an exposed part of the resist material that is not under the dummy gate to an oxide, wherein an unexposed part of the resist material is under the dummy gate,
selectively removing the dummy gate and the unexposed resist material,
forming a gate between the functional layers and between the exposed resist material at the first end and the exposed resist material at the second end of the section, thus obtaining aligned gates for the functional layers wherein the functional layers are corresponding with the nanowires or nanosheets.

2. The method according to claim 1, wherein the provided resist material is hydrogen silsesquioxane.

3. The method according to claim 1, wherein the resist material is applied by spin coating.

4. The method according to claim 1, wherein the at least partly removing of the stack of sacrificial layers is done such that a pillar of the stack of sacrificial layers is remaining wherein a width of this pillar is shorter than a predefined gate length.

5. The method according to claim 1, wherein forming the gate comprises:
depositing gate dielectric material around the nanowires or nanosheets,
depositing gate material around the gate dielectric material thereby forming the gate.

6. The method according to claim 1, wherein at least partly removing the stack of sacrificial layers to form the void is done by isotropic etching.

7. The method according to claim 1, the method comprising a step wherein a source is formed at one side of a nanowire material next to the dummy gate or gate and a drain is formed at an opposite end of the nanowire material at the opposite side of the dummy gate or gate.

8. The method according to claim 1, the method comprising an implant anneal step only after removing the unexposed resist material.

9. The method according to claim 1, wherein providing the wafer comprises depositing a stack of layers on a substrate, the stack of layers comprising alternating sacrificial and functional layers and forming at least one fin in the stack of layers.

10. The method according to claim 9, wherein the depositing of the stack of layers comprises depositing at least two functional layers.

11. The method according to claim 10, wherein the depositing of the stack of layers comprises depositing at least three functional layers.

12. The method according to claim 9, wherein the depositing of the stack of layers comprises depositing functional layers which are comprising Silicon, or SiGe, or Ge, or InGaAs, or III-V material.

13. The method according to claim 12, wherein the depositing of the stack of layers comprises depositing functional layers which are comprising Ge and sacrificial layers which are comprising SiGe.

14. The method according to claim 12, wherein the depositing of the stack of layers comprises depositing functional layers which are comprising Si and sacrificial layers which are comprising SiGe.

15. The method according to claim 1, wherein the at least partly removing of the stack of sacrificial layers is performed such that a pillar of the stack of sacrificial layers is remaining wherein a width of this pillar is shorter than a predefined gate length, and wherein the unexposed part of the resist material and the pillar are both covered by the dummy gate.

16. The method according to claim 1, further comprising: exposing the wafer to EUV light, applying an external spacer over the dummy gate.

* * * * *